(12) United States Patent
Koskinen et al.

(10) Patent No.: US 8,198,578 B2
(45) Date of Patent: *Jun. 12, 2012

(54) COLOR FILTERS FOR SUB-DIFFRACTION LIMIT-SIZED LIGHT SENSORS

(75) Inventors: Samu T. Koskinen, Tampere (FI); Ossi M. Kalevo, Toijala (FI); Tero Rissa, Siivikkala (FI); Juha H. Alakarhu, Helsinki (FI)

(73) Assignee: Nokia Corporation, Espoo (FI)

( * ) Notice: Subject to any disclaimer, the term of this patent is extended or adjusted under 35 U.S.C. 154(b) by 311 days.

This patent is subject to a terminal disclaimer.

(21) Appl. No.: 12/456,901

(22) Filed: Jun. 23, 2009

(65) Prior Publication Data
US 2010/0320369 A1 Dec. 23, 2010

(51) Int. Cl.
*G01J 3/50* (2006.01)
(52) U.S. Cl. .................. 250/226; 250/208.1
(58) Field of Classification Search .......... 250/226, 250/208.1, 214 R, 216, 336.1; 348/222–273, 348/342; 257/80–85, 440
See application file for complete search history.

(56) References Cited

U.S. PATENT DOCUMENTS

| | | | |
|---|---|---|---|
| 3,981,565 A | 9/1976 | Karasawa | 359/234 |
| 4,011,016 A | 3/1977 | Layne et al. | 356/195 |
| 5,965,875 A | 10/1999 | Merrill | 250/226 |
| 6,252,577 B1 | 6/2001 | Rashkovskiy et al. | 345/670 |
| 6,704,046 B2 * | 3/2004 | Dyas et al. | 348/223.1 |
| 6,727,521 B2 | 4/2004 | Merrill | 257/98 |
| 6,864,557 B2 | 3/2005 | Turner et al. | 257/440 |
| 6,924,167 B1 | 8/2005 | Hopper et al. | 438/57 |
| 6,960,757 B2 | 11/2005 | Merrill et al. | 250/256 |
| 7,166,880 B2 | 1/2007 | Merrill et al. | 257/294 |
| 7,916,193 B2 | 3/2011 | Fossum | 348/272 |
| 2002/0114526 A1 | 8/2002 | Dennis | 382/232 |
| 2004/0178465 A1 | 9/2004 | Merrill et al. | 257/440 |
| 2004/0218073 A1 | 11/2004 | Kalevo et al. | 348/272 |
| 2004/0245592 A1 | 12/2004 | Harmon et al. | 257/438 |
| 2005/0185075 A1 | 8/2005 | Neter | 348/294 |

(Continued)

FOREIGN PATENT DOCUMENTS
EP 1667246 A1 6/2006
(Continued)

OTHER PUBLICATIONS

L. Sbaiz, et al, "The Gigavision Camera", IEEE International Conference on Acoustics, Speech and Signal Processing 2009, pp. 1093-1096, Apr. 19-24, 2009.

(Continued)

*Primary Examiner* — Que T Le
(74) *Attorney, Agent, or Firm* — Harrington & Smith

(57) ABSTRACT

An apparatus includes an array of sub-diffraction limit-sized light receptors formed in a substrate having a light receiving surface. Each light receptor may be configured to output a binary valued bit element and to change state between an off-state and an on-state by the absorption of at least one photon. The apparatus further includes an optical filter structure disposed over the light receiving surface, the optical filter structure having of an array of filter pixels each having an associated passband spectral characteristic. A data element obtained from the array of sub-diffraction limit-sized light receptors is composed of a plurality of the bit elements output from a plurality of light receptors that underlie filter pixels having at least two different passband spectral characteristics.

21 Claims, 11 Drawing Sheets

U.S. PATENT DOCUMENTS

| | | | |
|---|---|---|---|
| 2006/0033114 A1 | 2/2006 | Schranz et al. | 357/88 |
| 2006/0054782 A1 | 3/2006 | Olsen et al. | 250/208.1 |
| 2006/0124832 A1 | 6/2006 | Harmon et al. | 250/214 R |
| 2007/0045685 A1 | 3/2007 | Yang et al. | 257/294 |
| 2008/0011937 A1 | 1/2008 | Toshikiyo | 250/208.1 |
| 2008/0128698 A1 | 6/2008 | Martin et al. | 257/55 |
| 2009/0251581 A1 | 10/2009 | Cha et al. | 348/308 |
| 2010/0033604 A1 | 2/2010 | Solomon | 348/241 |
| 2010/0320368 A1* | 12/2010 | Koskinen et al. | 250/226 |
| 2010/0321542 A1* | 12/2010 | Koskinen et al. | 348/273 |

FOREIGN PATENT DOCUMENTS

| | | |
|---|---|---|
| EP | 2 149 904 A2 | 2/2010 |
| WO | WO-2004-099865 A2 | 11/2004 |
| WO | WO 2008/067472 A2 | 6/2008 |
| WO | WO 2008/082569 A1 | 7/2008 |
| WO | WO 2009/136989 A1 | 11/2009 |

OTHER PUBLICATIONS

E. Fossum, "Gigapixel Digital Film Sensor (DFS) Proposal", Nanospace Manipulation of Photons and Electrons for Nanovision Systems, Oct. 25-26, 2005.

"Digital optical position-sensitive detector (PSD)", Anssi Makynen, et al., IMTC 2004—Instrumentation and Measurement, IEEE 2004, pp. 2358-2360.

Gigapixel Digital Film Sensor (DFS) Proposal, Eric R. Fossum, $7^{th}$ Takayanagi Kenjiro Memorial Symposium and the $2^{nd}$ International Symposium on Nanovision Science, University of Shizuoka, Oct. 2005, 5 pgs.

"Bayer filter", http://en.wikipedia.org/wiki/Bayer_filter, May 15, 2009, 4 pgs.

"Foveon X3 sensor", http://en.wikipedia.org/wiki/Foveon_X3_sensor, May 15, 2009, 6 pgs.

U.S. Appl. No. 12/384,549, filed Apr. 6, 2009, entitled "Image Sensor", Ossi M. Kalevo, Samu T. Koskinen and Tero Rissa.

* cited by examiner

| G | R | G | R | G | R |
|---|---|---|---|---|---|
| B | G | B | G | B | G |
| G | R | G | R | G | R |
| B | G | B | G | B | G |
| G | R | G | R | G | R |
| B | G | B | G | B | G |

ONE RECEPTOR

R=RED
G=GREEN
B=BLUE

FIG.1

| V | R | G1 | G | G2 | B1 |
|---|---|---|---|---|---|
| B2 | B3 | G3 | G4 | O | R |
| R1 | Y | Y1 | G | B | B1 |
| B2 | B3 | B3 | Y | Y2 | R2 |
| V | V1 | V2 | V3 | V3 | V2 |
| Y | V | O | B3 | G2 | G3 |

ONE RECEPTOR (SUB-DIFFRACTION LIMIT)

R=RED
G=GREEN
B=BLUE
O=ORANGE
V=VIOLET
Y=YELLOW

FIG.3

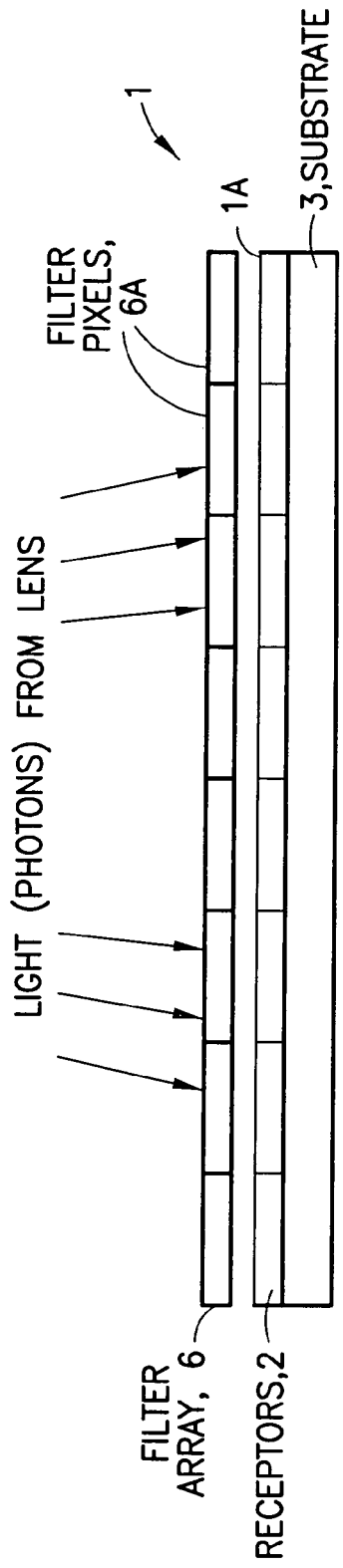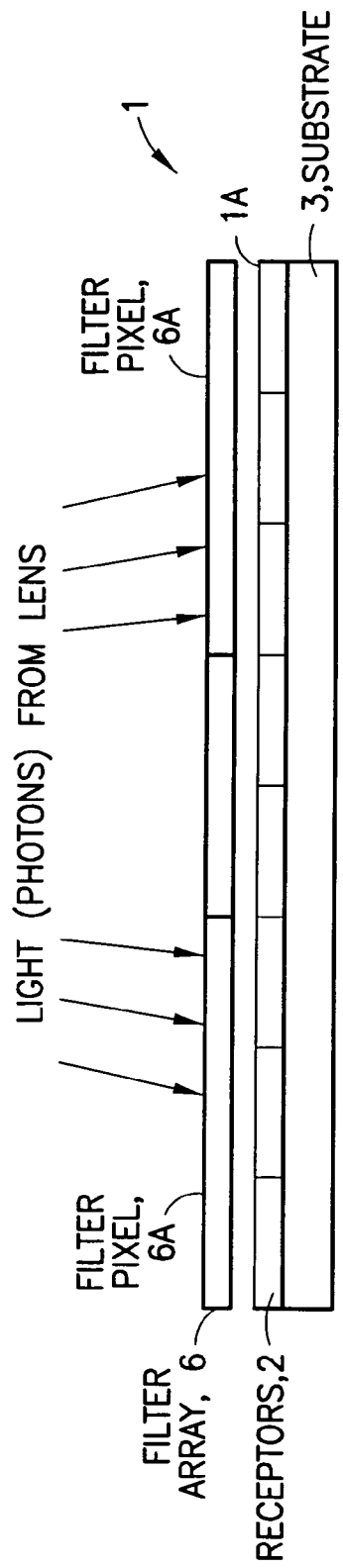

```
┌─────────────────────────────────────────────────────┐
│ ILLUMINATING A LIGHT RECEIVING SURFACE OF AN        │
│ ARRAY OF SUB-DIFFRACTION LIMIT-SIZED LIGHT RECEPTORS,│
│ WHERE EACH LIGHT RECEPTOR IS CONFIGURED TO OUTPUT A │
│ BINARY VALUED BIT ELEMENT AND TO CHANGE STATE       │
│ BETWEEN AN OFF-STATE AND AN ON-STATE BY THE         │──10A
│ ABSORPTION OF AT LEAST ONE PHOTON, WHERE            │
│ ILLUMINATING OCCURS THROUGH AN OPTICAL FILTER       │
│ STRUCTURE DISPOSED OVER THE LIGHT RECEIVING SURFACE,│
│ WHERE THE OPTICAL FILTER STRUCTURE IS COMPRISED OF AN│
│ ARRAY OF FILTER PIXELS EACH HAVING AN ASSOCIATED    │
│ PASSBAND SPECTRAL CHARACTERISTIC                    │
└─────────────────────────────────────────────────────┘
                            │
                            ▼
┌─────────────────────────────────────────────────────┐
│ AT THE END OF AN EXPOSURE PERIOD, READING OUT       │
│ BINARY VALUED BIT ELEMENTS AND FORMING A DATA       │
│ ELEMENT COMPRISED OF A PLURALITY OF BIT ELEMENTS    │──10B
│ OUTPUT FROM A PLURALITY OF LIGHT RECEPTORS THAT     │
│ UNDERLIE FILTER PIXELS HAVING AT LEAST TWO DIFFERENT│
│ PASSBAND SPECTRAL CHARACTERISTICS                   │
└─────────────────────────────────────────────────────┘
```

FIG.10

ILLUMINATING A LIGHT RECEIVING SURFACE OF AN ARRAY OF SUB-DIFFRACTION LIMIT-SIZED LIGHT RECEPTORS, WHERE EACH LIGHT RECEPTOR IS CONFIGURED TO OUTPUT A SCALAR VALUED MULTI-BIT ELEMENT AND TO CHANGE STATE BASED ON THE ABSORPTION OF AT LEAST ONE PHOTON, WHERE ILLUMINATING OCCURS THROUGH AN OPTICAL FILTER STRUCTURE DISPOSED OVER THE LIGHT RECEIVING SURFACE, WHERE THE OPTICAL FILTER STRUCTURE IS COMPRISED OF AN ARRAY OF FILTER PIXELS EACH HAVING AN ASSOCIATED PASSBAND SPECTRAL CHARACTERISTIC — 11A

AT THE END OF AN EXPOSURE PERIOD, READING OUT SCALAR VALUED MULTI-BIT ELEMENTS AND FORMING A DATA ELEMENT COMPRISED OF A COMBINATION OF A PLURALITY OF MULTI-BIT ELEMENTS OUTPUT FROM A PLURALITY OF LIGHT RECEPTORS THAT UNDERLIE FILTER PIXELS HAVING AT LEAST TWO DIFFERENT PASSBAND SPECTRAL CHARACTERISTICS — 11B

FIG.11

COLOR FILTERS FOR SUB-DIFFRACTION LIMIT-SIZED LIGHT SENSORS

TECHNICAL FIELD

The exemplary embodiments of this invention relate generally to sensors of electromagnetic radiation and, more specifically, relate to solid state image sensor arrays having light receptors characterized as having sub-diffraction limit dimensions and to color filters used therewith.

BACKGROUND

A two dimensional 1-bit receptor array has been described as a digital-film sensor (DFS), which is an array of deep-SDL (sub-diffraction-limit) pixels, defined as those smaller than a 550 nm Airy disk diameter, wherein each pixel is a fraction of a micron in size. While several photoelectrons could contribute to pushing the output signal above some threshold, ultimately single photoelectron sensitivity is said to be desired. It is said that a pixel that only needs to detect a single photoelectron has much lower performance requirements for full-well capacity and dynamic range than an analog pixel in a conventional image sensor. These specialized pixels have been referred to as "jots".

The implementation of a jot may be by making a conventional active pixel with very high conversion gain (low capacitance). Other approaches are said to include using avalanche or impact ionization effects to achieve in-pixel gain, as well as the possible application of quantum dots and other nanoelectronic devices. It is stated that stacked structures are also possible.

In operation, at the start of the exposure period the jot would be reset to a logical '0'. If it is then hit by a photon during exposure the jot is set to a logical '1' immediately or upon readout. Due to the single-bit nature of the "analog-to-digital" conversion resolution, it is said that high row-readout rates can be achieved.

It is said that color can be handled in a manner analogous to current color image sensors. That is, the jots could be covered with color filters. In this case red (R), green (G) and blue (B) jots could be treated separately, and later the digitally developed images combined to form a conventional RGB image. It is said that R, G, and B jots need not appear at the same spatial frequency.

Typical technologies for generating color images rely on the Bayer sensor and its variations. Other techniques include the use of color wheels and prisms. FIG. 1 shows a typical Bayer-type pattern having a combination of RGB filter elements. The use of more G filter elements than R or B filter elements is to mimic the greater resolving power of the human eye to green light. Other filter types include, by example, CYGM filters (cyan, yellow, green magenta) and RGBE filters (red, green, blue, emerald). It is also known to use a transparent or white filter element to provide infrared sensitivity.

SUMMARY

In one aspect thereof the exemplary embodiments of this invention provide an apparatus that comprises an array of sub-diffraction limit-sized light receptors formed in a substrate having a light receiving surface. The apparatus further includes an optical filter structure disposed over the light receiving surface, the optical filter structure being comprised of an array of filter pixels each having an associated passband spectral characteristic. Each light receptor may be configured to output a binary valued bit element and to change state between an off-state and an on-state by the absorption of at least one photon. A data element obtained from the array of sub-diffraction limit-sized light receptors is comprised of a plurality of the bit elements output from a plurality of light receptors that underlie filter pixels having at least two different passband spectral characteristics.

In another aspect thereof the exemplary embodiments of this invention provide a method that comprises illuminating a light receiving surface of an array of sub-diffraction limit-sized light receptors. Each light receptor is configured to output a binary valued bit element and to change state between an off-state and an on-state by the absorption of at least one photon. The step of illuminating occurs through an optical filter structure disposed over the light receiving surface, where the optical filter structure is comprised of an array of filter pixels each having an associated passband spectral characteristic. The method further includes, at the end of an exposure period, reading out binary valued bit elements and forming a data element comprised of a plurality of bit elements output from a plurality of light receptors that underlie filter pixels having at least two different passband spectral characteristics.

BRIEF DESCRIPTION OF THE DRAWINGS

The foregoing and other aspects of the exemplary embodiments of this invention are made more evident in the following Detailed Description, when read in conjunction with the attached Drawing Figures, wherein:

FIG. 1 shows a typical Bayer-type pattern having a combination of RGB filter elements.

FIG. 3 shows an exemplary filter pattern, in accordance with the exemplary embodiments of this invention, having significantly more color filters than the conventional (e.g., Bayer) pattern shown in FIG. 1.

FIGS. 7A and 7B show the sensor array of FIG. 4 with a filter array, constructed in accordance with the exemplary embodiments of this invention, disposed between a light receiving surface and the light being detected.

FIG. 10 is a logic flow diagram that is descriptive of the operation of a method, as well as at least partially the execution of computer program instructions, in accordance with exemplary embodiments of this invention.

FIG. 11 is another logic flow diagram that is descriptive of the operation of a method, as well as at least partially the

DETAILED DESCRIPTION

Figure 2:
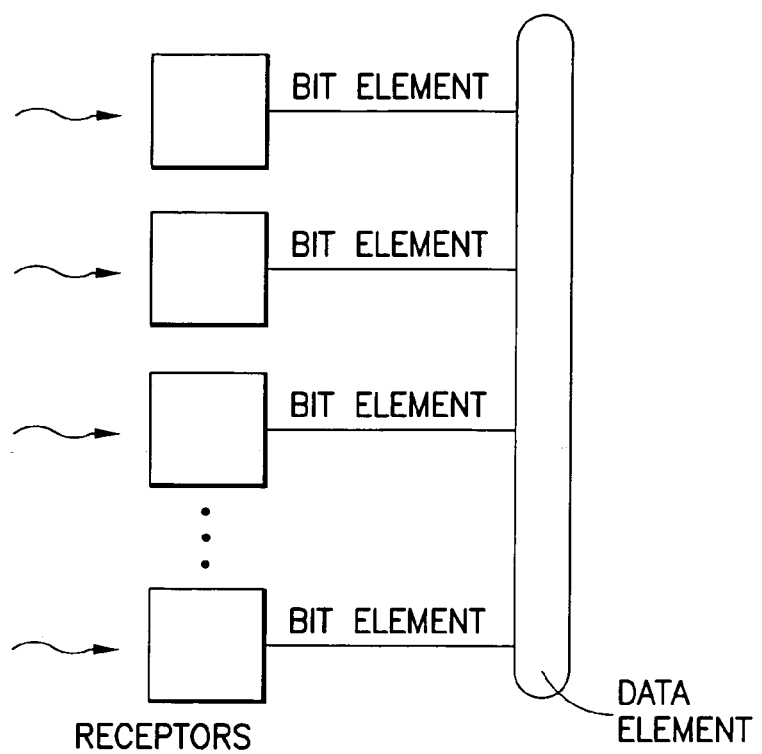
FIG. 2 is a conceptual drawing that illustrates the concepts of receptors, bit elements and a data element.

Referring to FIG. 2, in the following description a "receptor" is considered to be a physical sensor element that transforms light into charge carriers (e.g., electrons). A "bit element" is considered to be a conceptual 1-bit data element that indicates the light exposure of one receptor. A "multi-bit element" is considered to be a conceptual n-bit data element, where n>1, that indicates the light exposure of one receptor. A "data element" is considered to be a combination of a plurality of bit and/or multi-bit elements, and may be composed of from two to some arbitrarily large number of constituent bit and/or multi-bit elements. As non-limiting examples, the data element may comprise a sequence of bit and/or multi-bit elements or some other combination of bit and/or multi-bit elements (e.g., a sum or average).

The exemplary embodiments of this invention relate at least in part to imaging sensor technology, such as light sensor technologies used in color cameras. As was discussed above, some current color camera sensors are implemented by using two dimensional pixel arrays that measure light levels by storing charges generated by incoming light. A color filter array disposed between the pixel array and the incoming light enables the pixel array to detect color. The stored charges may be digitized by using floating diffusion and analog to digital converter (ADC) circuitry. The detected image(s) are then processed and the result is a stored image or video.

There are a number of problems associated with conventional image sensor technology. For example, the color accuracy may be less than optimum because, typically, only some relatively small number (e.g., three) of different color filters are used. However, increasing the number of color filters decreases the resolution. Further, color filters can reduce the sensitivity of the sensor since there are optical losses in the filters, resulting in a loss of photons that are not available for imaging purposes.

The exemplary embodiments of this invention use an array having a large number of sub-diffraction limit receptors in combination with a color filter array. The color filter array may be designed much more freely than conventional color filter arrays since a data element is created from multiple bit elements. As a result, several different kinds of color filters with known spectral response (e.g., bandpass, bandstop, lowpass and highpass) may be used per one data element.

The receptors may be simple and extremely small, providing sub-diffraction limit operation, and the sampling frequency for a data element may be much greater than the Nyquist frequency. This enables the use of the multiple filters (e.g., bandpass, bandstop, lowpass, highpass), since the resolution is not degraded even when the outputs of several receptors are combined into a single data element. A dynamic optimization between resolution and color fidelity and sensitivity may be achieved by creating the data elements from different numbers of receptors.

Contrasting FIG. 3 with FIG. 1, the optical filters made possible by the use of the exemplary embodiments of this invention enable a plurality of different filter types to be used in any desired combinations with underlying sub-diffraction limit receptors. Note in FIG. 3 that, for example, G1, G2, G3 are intended to represent various different shades or variations of the wavelength band associated with the color green. In general, the darker the filter the narrower is the passband region.

Figure 4A:
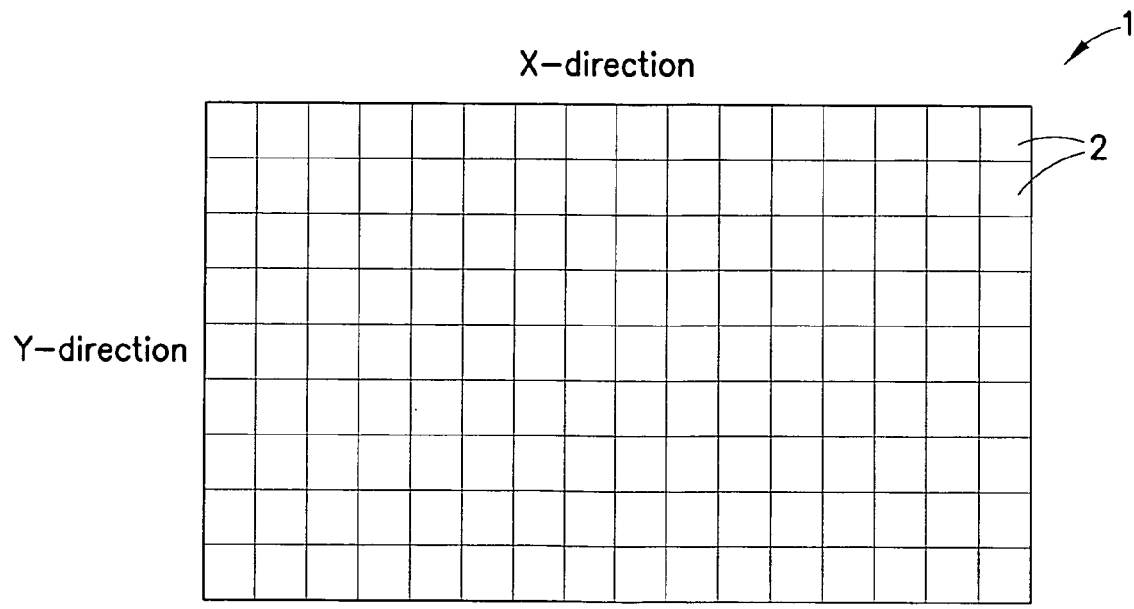
FIGS. 4A and 4B, collectively referred to herein as FIG. 4, are a simplified enlarged top view and elevational view, respectively, of a light sensor that is suitable for use with the exemplary embodiments of this invention.
Figure 4B:
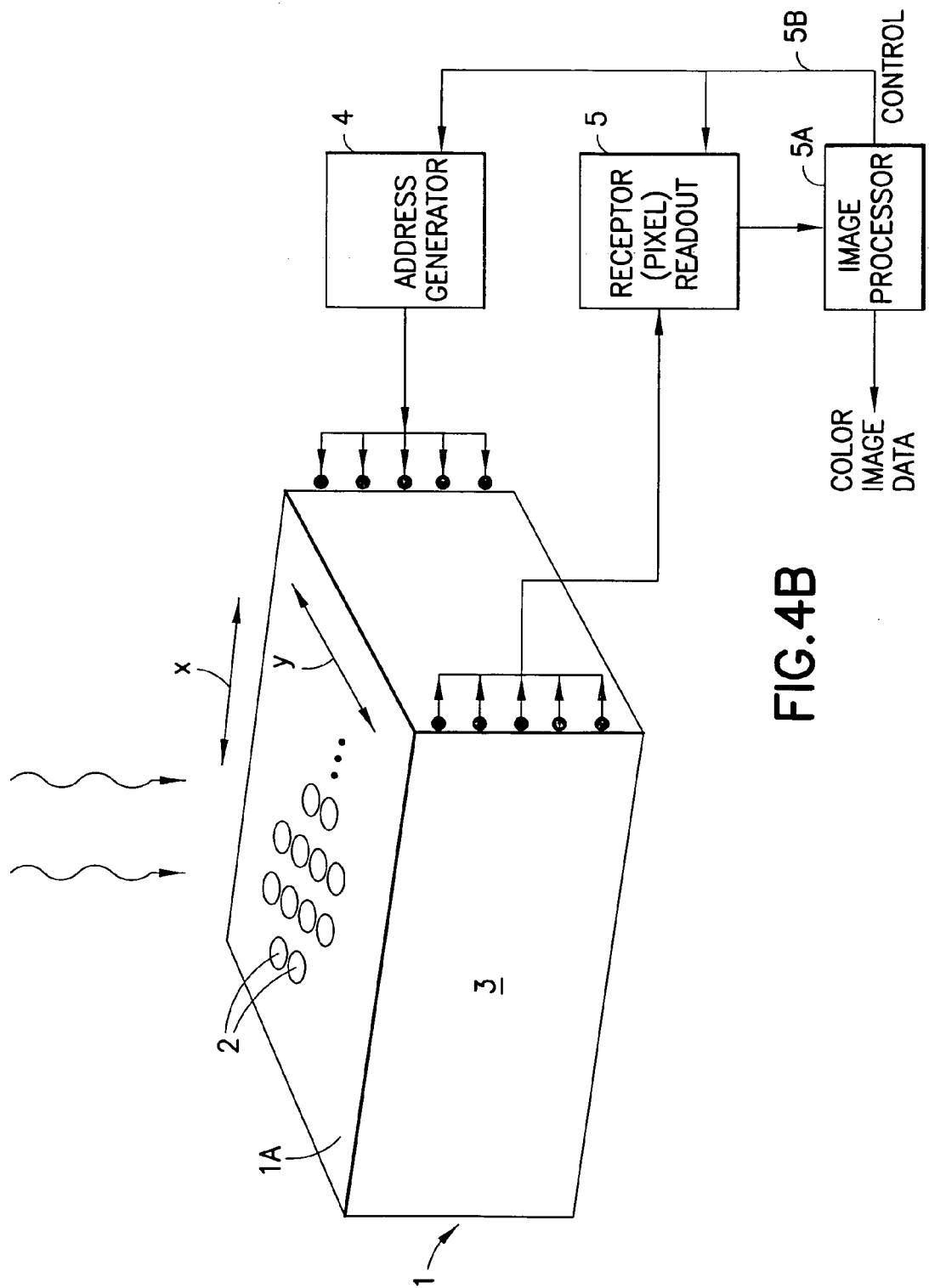

Referring to FIGS. 4A and 4B, the exemplary embodiments of this invention may be employed with a light sensor 1 that contains a large number of 1-bit light receptors 2 that are arranged as a two dimensional array of light receptors. The two dimensional array is organized as i light receptors 2 along an x-axis of the array and j light receptors 2 along a y-axis of the array, where i may or may not be equal to j. In the exemplary embodiments i and j may both have a value of, as a non-limiting example, about $10^6$. An optional lens (not shown in FIG. 4) may be disposed between the light receiving surface 1A and the scene being imaged.

Referring also to FIGS. 7A and 7B, in accordance with the exemplary embodiments of this invention, there is shown the sensor array 1 with a filter array 6 disposed between the light receiving surface 1A and the light being detected. The filter array 6 is composed of an array of discrete filter pixels 6A. The sensor array 1 with sub-diffraction limit receptors 2 (pixels) has enhanced freedom in selecting the characteristics of the color filter structures since one output pixel (data element) is generated from several bit elements arising from several receptors 2. This enables, for example, the use of high sensitivity color filters, spectral imaging, additional freedom in the selection of color filter materials and spectral properties, the use of a single color filter to cover a plurality of adjacent receptors 2, reduced or eliminated color artifacts that can be experienced with color interpolation, improved dynamic range when using color filters with different sensitivities, as well as an ability to use in some filter array locations neutral density filters or no filter at all.

FIG. 7A shows an embodiment where each of the filter pixels 6A is in registration with a single underlying one of the receptors 2, while FIG. 7B shows an embodiment where each of the filter pixels 6A overlies a plurality of adjacently disposed receptors 2. Each filter pixel 6A may thus be sized to cover the same number of underlying receptors 2, or may be sized, as shown in FIG. 7B, to cover different numbers of underlying receptors 2. In general, two or more adjacent filter pixels 6A may have the same filter spectral characteristic(s) or they may have different filter spectral characteristics.

The binary value of a particular receptor 2 (either 1 or 0) indicates the state of the receptor (on or off). A scene viewed by the sensor array 1 via the filter array 6 is converted to a color image by processing detected receptor values and calculating the image (resolution and colors) based on those receptor values.

The direction at which the light arrives is assumed to be within a field of view (FOV) of the sensor 1.

It may be beneficial in some embodiments that the receptors 2 in a center region of the sensor 1 be smaller than the receptors 2 nearer to the edges (those receptors at or near the image borders).

During operation, the individual receptors 2 of the sensor array 1 are reset to a known state (0 or 1). When light impinges on the sensor array 1 it is absorbed by certain ones of the receptors 2 and changes the state of those receptors (1 or 0). After some time period the sensor array 2 has captured a large number of photons and some possibly correspondingly large number of receptors 2 have experienced a change of state. At a point where there are more receptors 2 with value (1 or 0, i.e., receptors that have changed state from the initial reset state) then the probability that a photon will impinge on a receptor that is still in the reset state decreases. This results in the sensor 1 beginning to saturate. This type of nonlinear behavior may be taken into account when the receptor (pixel) values are subsequently processed.

The exposure time of the sensor 1 may be based on previously captured image(s). It is also within the scope of the exemplary embodiments, if there is some mechanism in place that enables one to determine a number of receptors 2 that have changed state, to terminate the exposure after some threshold number of receptors 2 have changed state (e.g., 15%). This mechanism may be based on performing multiple successive non-destructive read cycles of the sensor 1, and continuing until some threshold number of receptors 2 has changed state.

Note that while the sensor 1/filter array 6 combination is wavelength (color) responsive, and thus finds utility as a color imager or a spectral imager, it may be used as well to create black and white and monochrome images. If the amount of incident light is small it may be beneficial to process only reduced resolution luminance information from the sensor 1. When the scene is lighter then the resolution, and also color accuracy, may be increased.

A plurality of adjacent receptors 2 may be grouped together to form a single image pixel, and the number of receptors in a particular group may change from exposure to exposure, and the number may be different for different groups during a single exposure. For example, there may be fewer receptors 2 per group towards the center of the light receiving surface 2A and more receptors 2 per group at the edges of the light receiving surface 2A.

The array of receptors 2 may be read, for example, by using technology similar to that found in random access memory, such as dynamic random access memory (DRAM). That is, the sensor 1 may be viewed as representing an array of i×j addressable one bit storage locations (see also FIG. 4B). The sensor 1 may be configured such that the receptor values are always reset during a read cycle, or it may be configured that the reset operation is performed separate from the read operation.

Note that in FIG. 4B the electrical connections are shown for convenience as being made to the vertical sides of the substrate 3, and not by way of limitation. For example, in certain embodiments it may be preferable to provide the electrical contacts at the top surface (the light receiving surface 1A), or at the bottom surface, or at both the top and bottom surfaces.

Due to the potentially large number of receptors 2 each individual receptor may be designed to have minimal complexity, thereby enabling the sensor 1 to be manufactured with increased yield as compared to conventional sensor arrays. Any defective receptors 2, e.g., those with stuck at zero or stuck at one faults, may be identified and their locations mapped and compensated for (such as by using interpolation from adjacent operational receptors 2) during image processing.

FIG. 4B shows the sensor array 1 with exemplary x-y (row/column) address generation circuitry 4 and receptor (pixel) readout circuitry 5. The receptor readout circuitry 5 receives from the sensor array 1 a stream or streams of essentially binary data (ones and zeros) corresponding to those receptors 2 that are turned on (i.e., that have absorbed at least one photon) and those receptors 2 that have not turned on (i.e., are still in the reset state by virtue of not having absorbed at least one photon, or some threshold number of photons). The receptor readout circuitry 5, or an image processor 5A, may be responsible for grouping together the outputs of light receptors into x-y light receptor groups or neighborhoods. The receptor readout circuitry 5 may include a compression function (any suitable compression function may be used, such as run-length encoding), or there may be a separate compression function prior to storage of the readout receptor values. The address generation circuitry 4 may generate, at any given time, addresses to readout the receptors 2 individually or in groups. Readout control may be provided from the image processor 5A via a control bus 5B. An output of the image processor 5A is color image data.

The circuitry of the receptors 2 need not be as complex as that found in many conventional CMOS/CCD sensors, as in the binary output embodiments there is no need to measure floating diffusion current/voltage with an A/D converter. Instead, it is only needed to measure that a particular receptor 2 (pixel) is on or off. Multiple p-n and n-p junctions may be used, but other alternatives can also be used. Also the size of a p-well or n-well (or the substrate) can be much smaller than in conventional CMOS/CCD sensors, since there is no need to store a large amount of charge.

Figure 5:
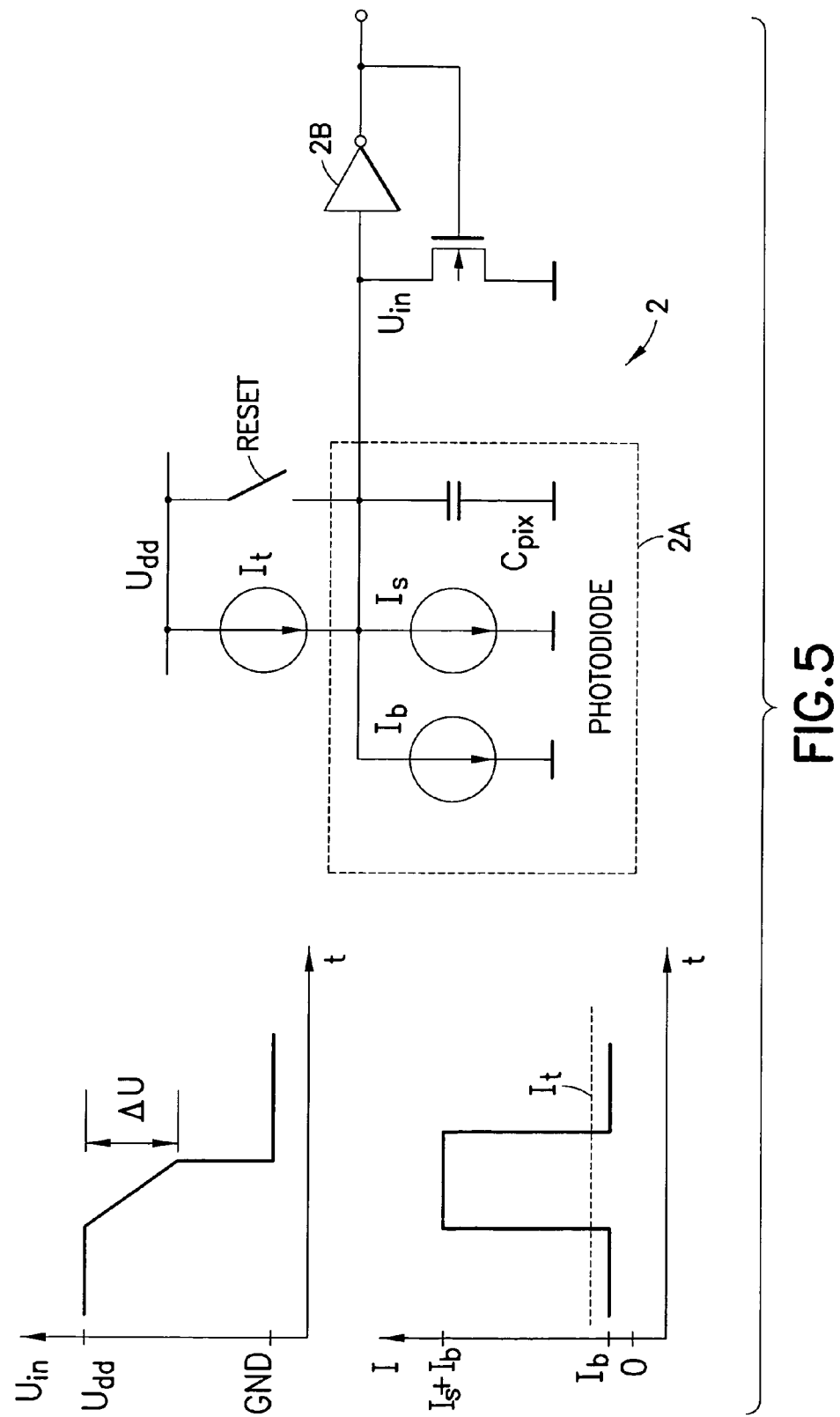
FIG. 5 depicts one suitable and non-limiting type of circuitry to implement the receptors of the light sensor of FIG. 4.

One suitable and non-limiting type of circuitry to implement the receptors 2 is shown in FIG. 5. In this case each receptor 2 includes a photodiode 2A connected with a simple inverter-based comparator circuit 2B for one-bit amplitude quantification. An adjustable threshold current may be used to prevent triggering due to background illumination. A receptor (pixel) is triggered when the signal current (plus background current) exceeds the threshold current $I_t$, and the voltage $U_{in}$ across $C_{pix}$ due to the discharging current $I_s+I_b-I_t$ goes below the threshold voltage ($\sim$$-$$U_{dd}/2$) of the comparator 2B. Assuming that $I_t$ is small compared with the amplitude of the signal pulse, the sensitivity of a pixel is determined by the optical energy $E_{pix}$ needed for discharging the input capacitance of a pixel:

$$E_{pix} \approx (C_{pix}\Delta U)/SK_F,$$

where $C_{pix}$ is the total input capacitance of a pixel, comprising the photodiode and circuit input capacitances, $\Delta U$ is the voltage change at the input needed to trigger the comparator 2B, S is the photodiode responsivity and $K_F$ the pixel fill factor.

In general, the dimensions of the receptors in the x and y axes may be, for example, in the range of about 0.1 to about 0.2 micrometers. The actual minimum dimensions of a receptor 2 may be assumed to depend at least in part on the specifics of the fabrication process, such as the wavelengths used for photolithography and similar process-dependent parameters. In general, the dimensions and distributions of the receptors 2 may be made a function of the sensor/device geometry, and may be based on a consideration of the chief ray angle (CRA).

The fabrication of the sensor array 1 may be accomplished by any suitable techniques, including forming multiple implanted/diffused p-n/n-p junctions and by the use of wafer bonding processing (as non-limiting examples).

The filter array 6 may be formed directly upon the light receiving surface 1A of the sensor array 1, or it may be formed on a separate substrate that is subsequently joined with, or positioned over, the light receiving surface 1A of the sensor array 1.

FIGS. 8A-8F are graphs that plot wavelength versus intensity, and illustrate various exemplary and non-limiting types of color filter spectral characteristics that may be used in the various filter pixels 6A of the filter array 6.

Figure 8A:
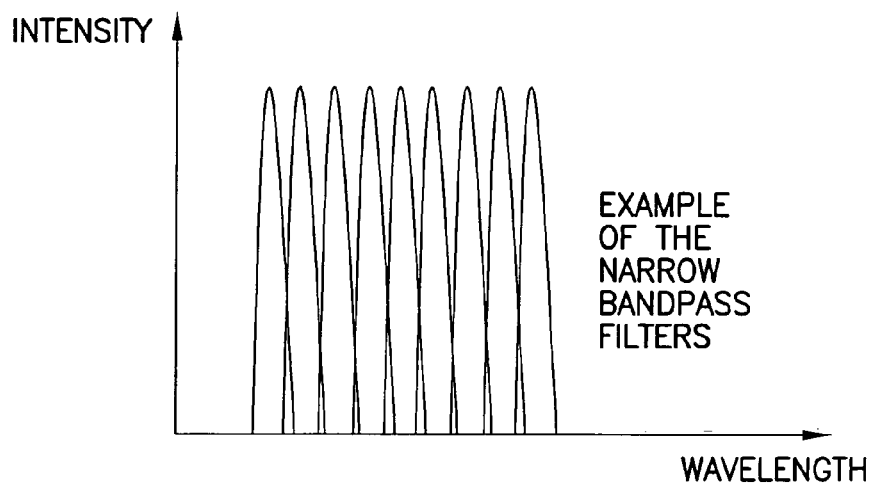
FIGS. 8A-8F are graphs that plot wavelength versus intensity, and illustrate various exemplary and non-limiting types of color filter spectral characteristics that may be used in the various filter pixels of the filter array shown in FIGS. 7A and 7B.

FIG. 8A depicts an example of narrow bandpass filters. These filters exhibit high selectivity which makes high color accuracy possible, assuming that there are sufficient different filters to cover the spectrum of interest (e.g., the visible spectrum). A spectral imager may be implemented with this approach.

Figure 8B:
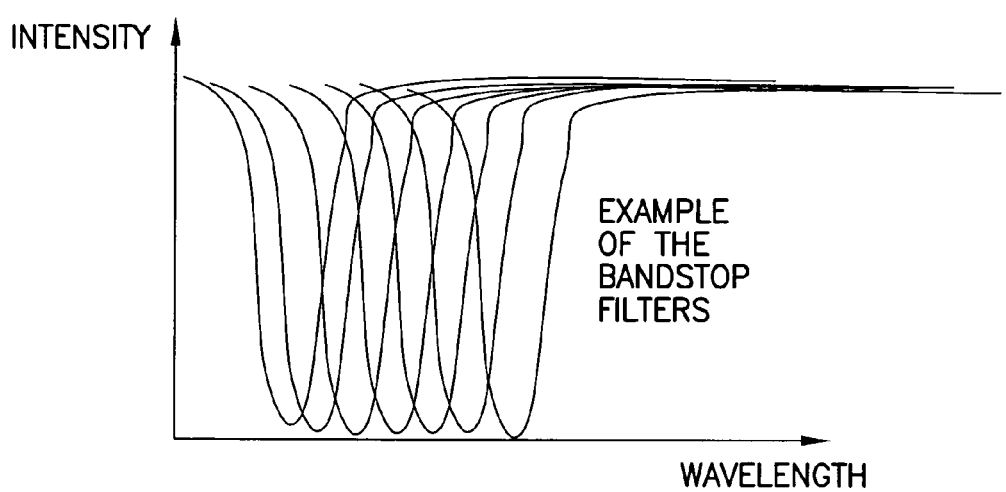

FIG. 8B depicts an example of bandstop filters, which provide high sensitivity.

Figure 8C:
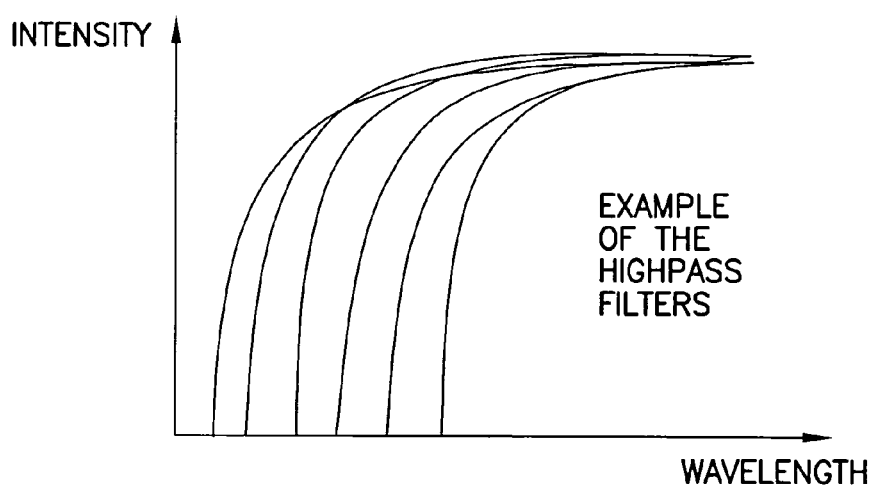

FIG. 8C depicts an example of highpass filters, which provide relatively high sensitivity and a typically low calculation complexity.

Figure 8E:
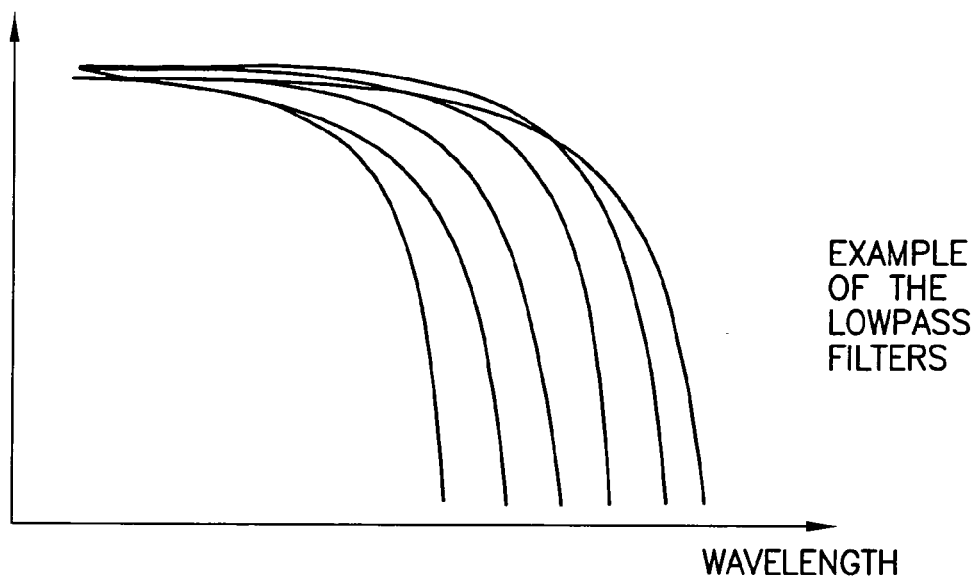
Figure 8F:
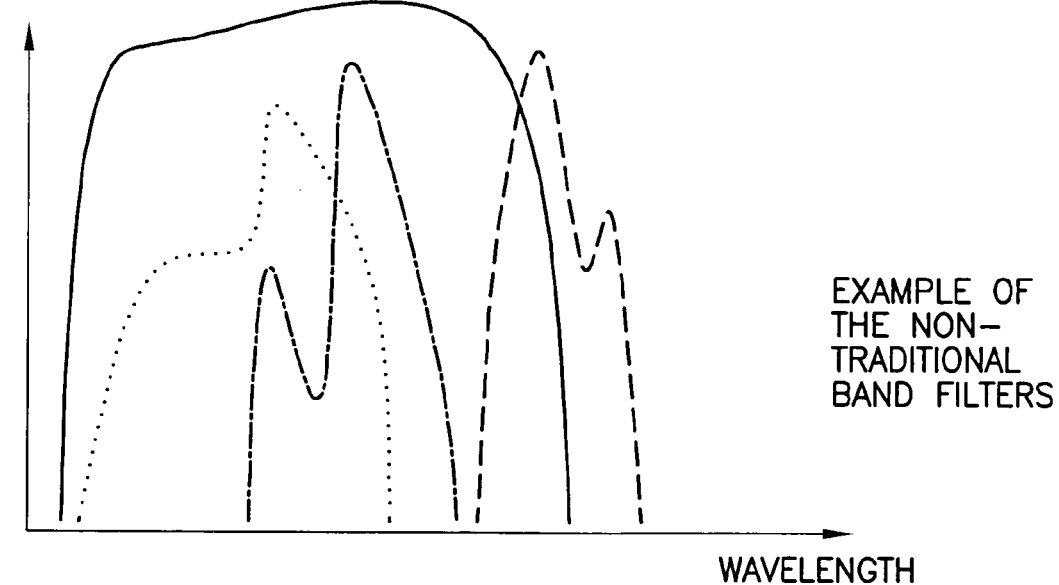
Figure 8D:
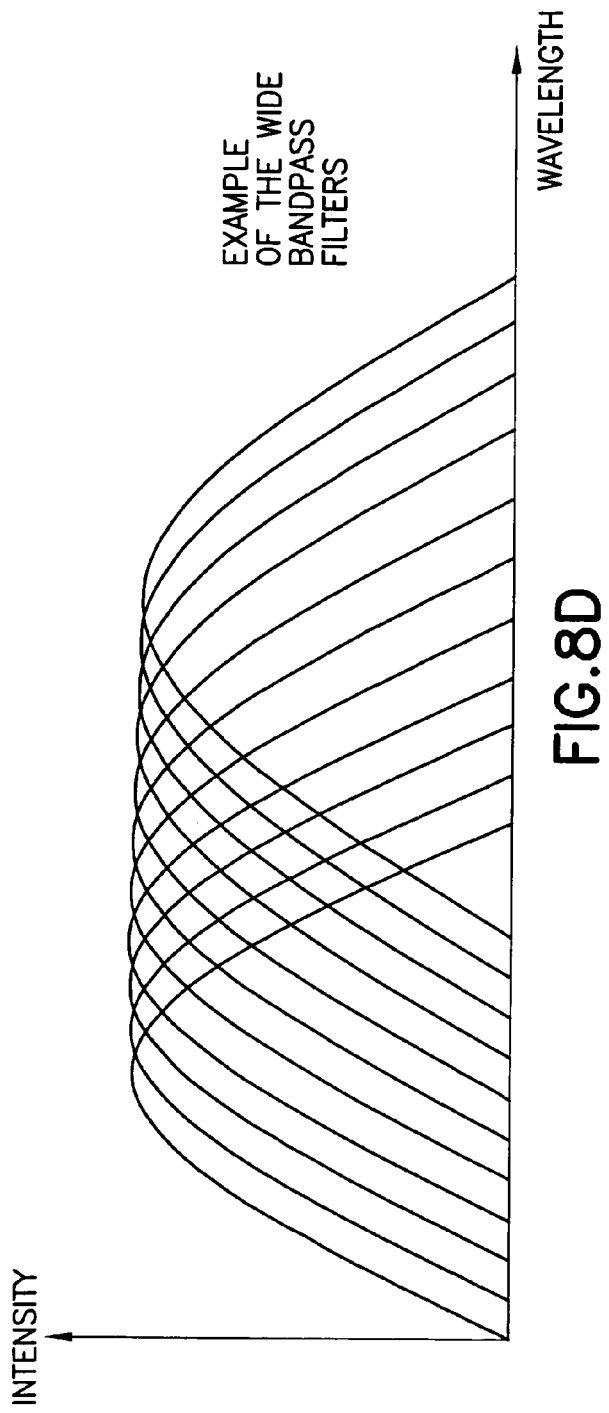

FIG. 8D depicts an example of wide bandpass filters. In this case the color information for each data element is calculated from several bit elements representing a plurality of different color filters that have wide pass-bands. This approach clearly enhances the sensitivity. Conventional R, G, and B filters discard about 67% of the total light as a comparison. High color accuracy and spectral imaging are possible to achieve due to the use of several different filters per data element.

Spectral imaging with wide bandpass filters can be illustrated with a simple example. Assume there are two filters, where filter A covers wavelengths 450-700 nm, filter B covers wavelengths 460-700 nm, and both filters have a flat spectral response. Assume that after collecting some light the filter A has collected 500 units of light and filter B 450 units of light. Thus, it is evident that the spectral band of 450-460 nm has received 50 units of light. As such, by the use of several such filters spectral imaging is made possible.

FIG. 8E depicts an example of lowpass filters, which provide relatively high sensitivity and a relatively small calculation complexity.

FIG. 8F depicts a non-limiting example of non-traditional band filters. Due to the fact that the data elements comprise several bit elements, it is possible to design filters that differ from more traditional filters, such as those shown in FIGS. 8A-8E, so long as the properties/spectral characteristics of the filters are known by the image signal processing algorithm(s) and devices. This type of filter may possibly be manufactured in a random or substantially random fashion, so long as the spectral response characteristics are characterized prior to use.

It is also within the scope of these exemplary embodiments to use totally transparent (i.e., no filter at all) and/or neutral density filter pixels 6A in order to enhance the dynamic range. Transparent filters exhibit high sensitivity, while neutral density filters artificially reduce the amount of light, but not the spectrum, and thus enable providing a higher dynamic range. It is also within the scope of these exemplary embodiments to use any combination of the filters shown in FIGS. 8A-8F, in combination with transparent and/or neutral density filters.

In certain cases it may be beneficial to vary the spectral characteristics of the filter array 6 within the image area. For example, the center area of the filter array 6 may have higher resolution and lower sensitivity, while corner areas may be optimized more for sensitivity than resolution, thus reducing a vignetting effect.

In addition to the various optical filter combinations discussed above, ultraviolet (UV) and infrared (IR) filters may also be used to reduce the presence of unwanted wavelengths, especially in the lowpass and highpass filter cases.

Figure 9:
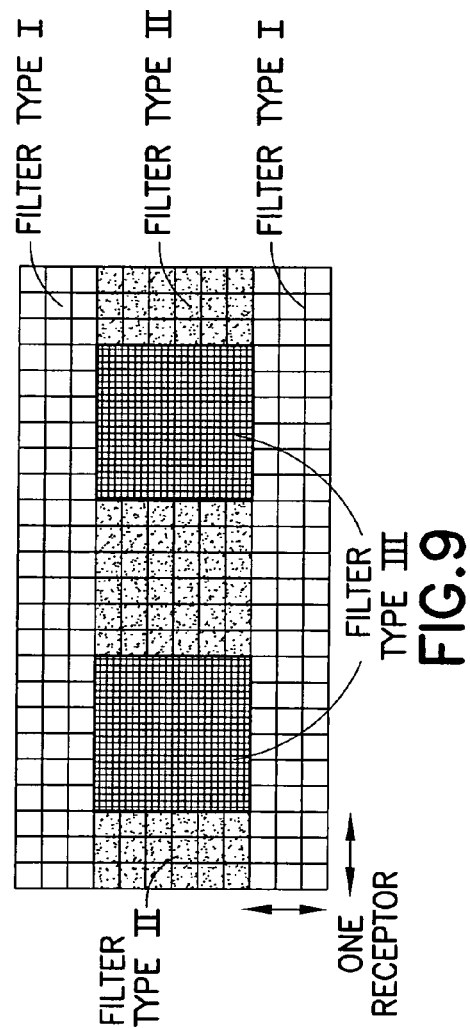
FIG. 9 shows an example of three filters of different types, each overlying a plurality of light receptors.

It should be noted that the color filters do not have to be separate for each receptor 2, as is the case with current technologies. This is illustrated in FIG. 7B, as well as in FIG. 9, where each of three different filter types is shown overlaying a plurality of the receptors 2.

It should also be noted that while the various filters have been shown having square or rectangular shapes they may in fact have any desired shape, including ovoid and irregular, thereby facilitating the implementation/manufacturing of the filter array 6.

The area of a single color filter may be maximized (as constrained by resolution and color accuracy requirements). This reduces color cross-talk, which is also not feasible with current implementations.

As was noted above, the exemplary embodiments of the present invention are not restricted for use with only the image/light sub-diffraction limit sized receptor 2 embodiments, and they may be used as well with other types and constructions of image/light sensors/receptors.

That is, the exemplary embodiments of this invention have been described to use a sensor array 1 having but a single plane of sub-diffraction limit receptors 2, each outputting a single bit binary value, where color discrimination is based solely on the overlying filter structure 6. However, in other embodiments each receptor may be capable of storing charge that is readout and digitized to a multi-bit representation. For example, one output pixel (data element) may be generated from several multi-bit elements arising from several receptors. In such a case, the values from the individual receptors are read and then combined.

As a non-limiting example, consider two 2-bit receptors (n=2) each of which outputs a multi-bit element having a value of 0, 1, 2 or 3 (00, 01, 10 or 11 in a binary form). The two multi-bit elements can be combined by summing or averaging, as non-limiting examples. For example, if the two multi-bit elements are 3 and 1, they may be combined by summing (3+1=4) or by averaging ((3+1)/2=2). Averaging of the values may be preferred for high bit count receptors, for example, because a sum of four 6-bit values is an 8-bit value whereas an average can still be shown with 6-bits. Such implementations could incur rounding errors in some cases. In other exemplary embodiments, the system may be configured to employ more than one type of combining and the type of combining in use may be dependent on the particular implementation or on some other factor (e.g., one or more internal or external conditions or parameters). The combining may be performed by a data processor, the image processor and/or one or more other components (e.g., adder, multiplier, register, averaging component), as non-limiting examples. As compared with the 1-bit exemplary embodiment, multi-bit embodiments may provide increased granularity and/or increased sensitivity, though likely at the expense of increased complexity. The actual balance (e.g., how many bits to use) may be dependent on various factors, such as the specific use in question or cost considerations, as non-limiting examples.

While described above with respect to light receptors outputting a binary valued element (e.g., based on the absorption of at least one photon), in further exemplary embodiments the output from the light receptors may not be binary values. As non-limiting examples, a light receptor outputting a multi-bit element may have an integer valued or scalar valued output.

Furthermore, the exemplary embodiments of this invention may use a light sensor (sensor array) of a type described in commonly owned U.S. patent application Ser. No. 12/384, 549, filed on Apr. 6, 2009, entitled "Image Sensor", Ossi M. Kalevo, Samu T. Koskinen and Tero Rissa. This commonly owned U.S. patent application describes a three dimensional array organized as i light receptors along an x-axis of the array, j light receptors along a y-axis of the array, and k light receptors along a z-axis of the array, where i may or may not be equal to j, and where i and j may each be much larger than k. The k 1-bit light receptors are vertically stacked from the light receiving surface into a depth of the substrate, which may be a silicon substrate. Due to the wavelength-dependent absorption coefficient of silicon, the deeper into the substrate that a particular light receptor is located (i.e., the further that it is located from the light receiving surface) the longer is the wavelength of light that reaches it and that may be absorbed and detected. Thus, while in certain embodiments the sensor array 1 may itself provide multi-color selectivity and sensitivity, it may also be advantageous to use this type of sensor array in conjunction with the color filter embodiments described above.

Figure 6:
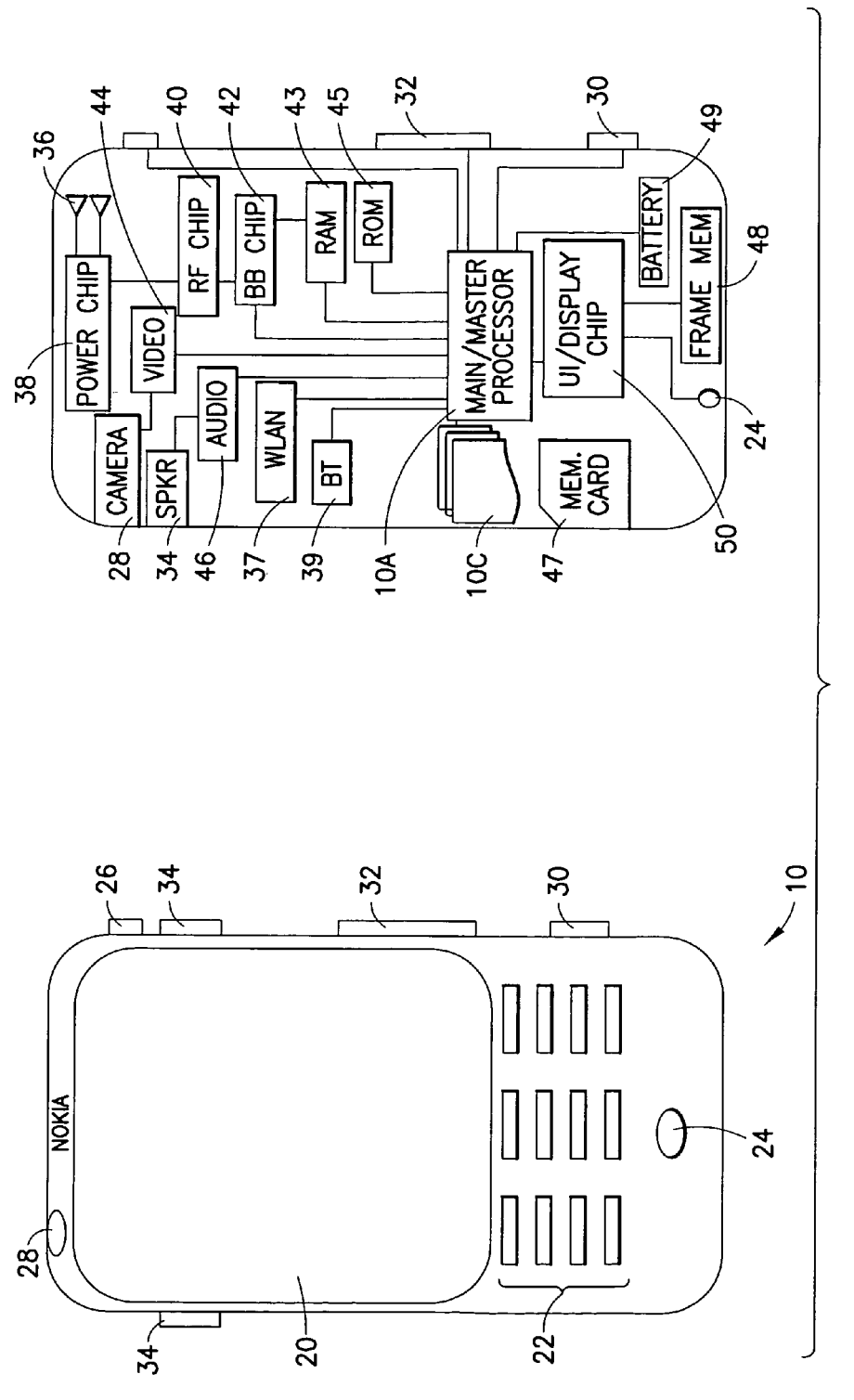
FIG. 6 shows a block diagram of a device that may be constructed to include the image sensor and color filter in accordance with the exemplary embodiments of this invention.

FIG. 6 illustrates an exemplary embodiment of a device, such as user equipment (UE) 10, in both plan view (left) and sectional view (right). In FIG. 6 the UE 10 has a graphical display interface 20 and a user interface 22 illustrated as a keypad but understood as also encompassing touch screen technology at the graphical display interface 20 and voice recognition technology received at the microphone 24. A power actuator 26 controls the device being turned on and off by the user.

The exemplary UE 10 includes a camera 28 which is shown as being forward facing (e.g., for video calls) but may alternatively or additionally be rearward facing (e.g., for capturing images and video for local storage). The camera 28 is controlled by a shutter actuator 30 and optionally by a zoom actuator 30 which may alternatively function as a volume adjustment for the speaker(s) 34 when the camera 28 is not in an active mode.

The camera 28 may be assumed to include an image sensor array 1 in combination with a filter array 6 constructed and operated in accordance with the exemplary embodiments of this invention.

Within the sectional view of FIG. 6 are seen multiple transmit/receive antennas 36 that are typically used for cellular communication. The antennas 36 may be multi-band for use with other radios in the UE. The operable ground plane for the antennas 36 is shown by shading as spanning the entire space enclosed by the UE housing though in some embodiments the ground plane may be limited to a smaller area, such as disposed on a printed wiring board on which the power chip 38 is formed. The power chip 38 controls power amplification on the channels being transmitted and/or across the antennas that transmit simultaneously where spatial diversity is used, and amplifies the received signals. The power chip 38 outputs the amplified received signal to the radio frequency (RF) chip 40 which demodulates and downconverts the signal for baseband processing. The baseband (BB) chip 42 detects the signal which is then converted to a bit stream and finally decoded. Similar processing occurs in reverse for signals generated in the apparatus 10 and transmitted from it.

Signals going to and from the camera 28 may pass through an image/video processor 44 that encodes and decodes the various image frames. At least part of the functionality of the image processor 5A shown in FIG. 4B may be incorporated in the image/video processor 44. A separate audio processor 46 may also be present controlling signals to and from the speakers 34 and the microphone 24. The graphical display interface 20 is refreshed from a frame memory 48 as controlled by a user interface chip 50 which may process signals to and from the display interface 20 and/or additionally process user inputs from the keypad 22 and elsewhere.

Certain embodiments of the UE 10 may also include one or more secondary radios such as a wireless local area network radio WLAN 37 and a Bluetooth radio 39, which may incorporate an antenna on the chip or be coupled to an antenna off the chip. Throughout the apparatus are various memories such as random access memory RAM 43, read only memory ROM 45, and in some embodiments there may be removable memory such as the illustrated memory card 47 on which the various programs 10C are stored. All of these components within the UE 10 are normally powered by a portable power supply such as a battery 49.

The processors 38, 40, 42, 44, 46, 50, if embodied as separate entities in a UE 10, may operate in a slave relationship to the main processor 10A, 12A, which may then be in a master relationship to them. Embodiments of this invention may be disposed across various chips and memories as shown, or disposed within another processor that combines some of the functions described above for FIG. 6 Any or all of these various processors of FIG. 6 access one or more of the various memories, which may be on chip with the processor or separate there from.

Note that the various integrated circuits (e.g., chips 38, 40, 42, etc.) that were described above may be combined into a fewer number than described and, in a most compact case, may all be embodied physically within a single chip.

Referring to FIG. 10, there is shown in logic flow diagram form a method that comprises (Block 10A) illuminating a light receiving surface of an array of sub-diffraction limit-sized light receptors. In the method each light receptor is configured to output a binary valued bit element and to change state between an off-state and an on-state by the absorption of at least one photon. The step of illuminating occurs through an optical filter structure disposed over the light receiving surface, where the optical filter structure is comprised of an array of filter pixels each having an associated passband spectral characteristic. The method further includes, in Block 10B, at the end of an exposure period, reading out binary valued bit elements and forming a data element comprised of a plurality of bit elements output from a plurality of light receptors that underlie filter pixels having at least two different passband spectral characteristics.

Referring to FIG. 11, there is shown in logic flow diagram form a method that comprises (Block 11A) illuminating a light receiving surface of an array of sub-diffraction limit-sized light receptors. In the method each light receptor is configured to output a scalar valued multi-bit element and to change state based on the absorption of at least one photon. The step of illuminating occurs through an optical filter structure disposed over the light receiving surface, where the optical filter structure is comprised of an array of filter pixels each having an associated passband spectral characteristic. The method further includes, in Block 11B, at the end of an exposure period, reading out scalar valued multi-bit elements and forming a data element comprised of a combination of a plurality of multi-bit elements output from a plurality of light receptors that underlie filter pixels having at least two different passband spectral characteristics.

In one exemplary embodiment of the invention, an apparatus comprises an array of sub-diffraction limit-sized light receptors formed in a substrate having a light receiving surface. Each light receptor is configured to output a binary valued bit element and to change state between an off-state and an on-state by the absorption of at least one photon. The apparatus further comprises an optical filter structure disposed over the light receiving surface, the optical filter structure comprised of an array of filter pixels each having an associated passband spectral characteristic. A data element obtained from said array of sub-diffraction limit-sized light receptors is comprised of a plurality of said bit elements output from a plurality of light receptors that underlie filter pixels having at least two different passband spectral characteristics.

In another exemplary embodiment of the invention, an apparatus comprises an array of sub-diffraction limit-sized means for receiving light (e.g., formed in a substrate) having a light receiving surface. Each means for receiving light is configured to output a binary valued bit element and to change state between an off-state and an on-state by the absorption of at least one photon. The apparatus further comprises an optical filter structure disposed over the light receiving surface, the optical filter structure comprised of an array of means for filtering light, each having an associated passband spectral characteristic. A data element obtained from said array of sub-diffraction limit-sized means for receiving light is comprised of a plurality of said bit elements output from a plurality of means for receiving light that underlie (e.g., at least two) means for filtering having at least two different passband spectral characteristics.

In another exemplary embodiment of the invention, an apparatus comprises an array of sub-diffraction limit-sized light receptors formed in a substrate having a light receiving surface. Each light receptor is configured to output a scalar valued multi-bit element and to change state based on the absorption of at least one photon. The apparatus further comprises an optical filter structure disposed over the light receiving surface, the optical filter structure comprised of an array of filter pixels each having an associated passband spectral characteristic. A data element obtained from said array of sub-diffraction limit-sized light receptors is comprised of a combination of a plurality of said multi-bit elements output from a plurality of light receptors that underlie filter pixels having at least two different passband spectral characteristics.

In another exemplary embodiment of the invention, an apparatus comprises an array of sub-diffraction limit-sized means for receiving light (e.g., formed in a substrate) having a light receiving surface. Each means for receiving light is configured to output a scalar valued multi-bit element and to change state based on the absorption of at least one photon. The apparatus further comprises an optical filter structure disposed over the light receiving surface, the optical filter structure comprised of an array of means for filtering, each having an associated passband spectral characteristic. A data element obtained from said array of sub-diffraction limit-sized means for receiving light is comprised of a combination of a plurality of said multi-bit elements output from a plurality of means for receiving light that underlie (e.g., at least two) means for filtering having at least two different passband spectral characteristics.

There are a number of technical effects that can be realized by the use of the exemplary embodiments of this invention. For example, optical sensor sensitivity can be enhanced, as can color accuracy be improved. Further, the use of these exemplary embodiments enables spectral imaging to be achieved. Further, the use of these exemplary embodiments provides additional freedom in the selection of color filter materials and spectral properties. Further, the use of these exemplary embodiments enables a single color filter (filter pixel 6A) to cover several receptors 2. In addition, color artifacts often experienced with color interpolation can be avoided. Further, the use of these exemplary embodiments provides for an enhanced dynamic range. Further, the use of these exemplary embodiments can reduce color cross-talk. Further still, the use of these exemplary embodiments enables a dynamic optimization between resolution and color fidelity and sensitivity to be realized by creating the data elements from differing amounts of receptors 2. In addition, the use of these exemplary embodiments provides a possibility to reduce vignetting.

In general, the various exemplary embodiments may be implemented in hardware or special purpose circuits, software, logic or any combination thereof. For example, some aspects may be implemented in hardware, while other aspects may be implemented in firmware or software which may be executed by a controller, microprocessor or other computing device, although the exemplary embodiments of this invention are not limited thereto. While various aspects of the exemplary embodiments of this invention may be illustrated and described as block diagrams, schematic diagrams or using some other pictorial representation, it is well understood that these blocks, apparatus, systems, techniques or methods described herein may be implemented in, as non-limiting examples, at least in part as hardware, software, firmware, special purpose circuits or logic, general purpose hardware or controller or other computing devices, or some combination thereof.

It should thus be appreciated that at least some aspects of the exemplary embodiments of the inventions may be practiced in various components such as integrated circuit chips and modules, and that the exemplary embodiments of this invention may be realized in an apparatus that is embodied as an integrated circuit. The integrated circuit, or circuits, may comprise circuitry (as well as possibly firmware) for embodying at least one or more of a data processor or data processors, a digital signal processor or processors, baseband circuitry and radio frequency circuitry that are configurable so as to operate in accordance with the exemplary embodiments of this invention.

Various modifications and adaptations to the foregoing exemplary embodiments of this invention may become apparent to those skilled in the relevant arts in view of the foregoing description, when read in conjunction with the accompanying drawings. However, any and all modifications will still fall within the scope of the non-limiting and exemplary embodiments of this invention.

Further by example, while the exemplary embodiments have been described above in FIG. 6 the context of a wireless communications device such as the UE 10, it should be appreciated that the exemplary embodiments of this invention are not limited for use with only this one particular type of wireless communication device, and that they may be used to advantage in other types of devices that may or may not have wireless communications capability, including digital cameras, PDAs, computers and gaming devices, as non-limiting examples.

Further by example, individual receptors 2 need not be transistor/photodiode based, but may be constructed using other types of devices, including quantum dots and other nanostructure devices.

Further by example, it should be realized that the various values given above for the numbers of receptors along the various axes are exemplary, and are not to be construed as being limiting.

Further by example, it should be realized that the various types of filters and combinations of filters that were discussed above are exemplary, and are not to be construed as being limiting.

Further by example, the exemplary embodiments of this invention are not to be construed as being limited to any of the specific materials, combinations of materials, fabrication processes, wavelengths and/or dimensions that were mentioned above.

It should be noted that the terms "connected," "coupled," or any variant thereof, mean any connection or coupling, either direct or indirect, between two or more elements, and may encompass the presence of one or more intermediate elements between two elements that are "connected" or "coupled" together. The coupling or connection between the elements can be physical, logical, or a combination thereof As employed herein two elements may be considered to be "connected" or "coupled" together by the use of one or more wires, cables and/or printed electrical connections, as well as by the use of electromagnetic energy, such as electromagnetic energy having wavelengths in the radio frequency region, the microwave region and the optical (both visible and invisible) region, as several non-limiting and non-exhaustive examples.

Furthermore, some of the features of the various non-limiting and exemplary embodiments of this invention may be used to advantage without the corresponding use of other features. As such, the foregoing description should be considered as merely illustrative of the principles, teachings and exemplary embodiments of this invention, and not in limitation thereof.

What is claimed is:

1. An apparatus, comprising:
an array of sub-diffraction limit-sized light receptors formed in a substrate having a light receiving surface, each sub-diffraction limit-sized light receptor is configured to output a binary valued bit element and to change state between an off-state and an on-state by the absorption of at least one photon; and
an optical filter structure disposed over the light receiving surface, the optical filter structure comprised of an array of filter pixels with each filter pixel having an associated passband spectral characteristic, and where a data element obtained from said array of sub-diffraction limit-sized light receptors is comprised of a plurality of said bit elements output from a plurality of sub-diffraction limit-sized light receptors that underlie filter pixels having at least two different passband spectral characteristics.

2. The apparatus as in claim 1, where the at least two different passband spectral characteristics are selected from a set of passband spectral characteristics comprising narrow bandpass, wide bandpass, bandstop, highpass and lowpass.

3. The apparatus as in claim 2, where the set of passband spectral characteristics further comprise a non-traditional band.

4. The apparatus as in claim 1, where at least some of the filter pixels are one of transparent pixels or neutral density pixels.

5. The apparatus as in claim 1, where a single filter pixel overlies a single light receptor.

6. The apparatus as in claim 1, where a single filter pixel overlies a plurality of light receptors.

7. The apparatus as in claim 1, where the apparatus is responsive to electromagnetic radiation in a wavelength range that extends at least from ultraviolet to infrared.

8. The apparatus as in claim 1, where filter pixels disposed near to a center of the optical filter structure have a different passband spectral characteristic than filter pixels disposed at a periphery of said optical filter structure.

9. The apparatus as in claim 1, where during a first readout period a first data element obtained from said array of sub-diffraction limit-sized light receptors is comprised of a first plurality of said bit elements output from a first plurality of sub-diffraction limit-sized light receptors, and where during a second readout period a second data element obtained from said array of sub-diffraction limit-sized light receptors is comprised of a second plurality of said bit elements output from a second plurality of sub-diffraction limit-sized light receptors, where at least one of the second plurality of sub-diffraction limit-sized light receptors is different from the first plurality of sub-diffraction limit-sized light receptors.

10. The apparatus as in claim 1, embodied as part of an image sensor within a device.

11. A method, comprising:
illuminating a light receiving surface of an array of sub-diffraction limit-sized light receptors, each sub-diffraction limit-sized light receptor being configured to output a binary valued bit element and to change state between an off-state and an on-state by the absorption of at least one photon, where illuminating occurs through an optical filter structure disposed over the light receiving surface, the optical filter structure comprised of an array of filter pixels with each filter pixel having an associated passband spectral characteristic; and
at the end of an exposure period, reading out binary valued bit elements and forming a data element comprised of a plurality of bit elements output from a plurality of sub-diffraction limit-sized light receptors that underlie filter pixels having at least two different passband spectral characteristics.

12. The method as in claim 11, where the at least two different passband spectral characteristics are selected from a set of passband spectral characteristics comprising narrow bandpass, wide bandpass, bandstop, highpass and lowpass.

13. The method as in claim 12, where the set of passband spectral characteristics further comprise a non-traditional band.

14. The method as in claim 11, where at least some of the filter pixels are one of transparent pixels or neutral density pixels.

15. The method as in claim 11, where a single filter pixel overlies a single light receptor.

16. The method as in claim 11, where a single filter pixel overlies a plurality of light receptors.

17. The method as in claim 11, where an apparatus comprises the array of sub-diffraction limit-sized light receptors and the optical filter structure, where the apparatus is responsive to electromagnetic radiation in a wavelength range that extends at least from the ultraviolet to the infrared.

18. The method as in claim 11, where filter pixels disposed near to a center of the optical filter structure have a different passband spectral characteristic than filter pixels disposed at a periphery of said optical filter structure.

19. The method as in claim 11, where during a first readout period a first data element obtained from said array of sub-diffraction limit-sized light receptors is comprised of a first plurality of said bit elements output from a first plurality of sub-diffraction limit-sized light receptors, and where during a second readout period a second data element obtained from said array of sub-diffraction limit-sized light receptors is comprised of a second plurality of said bit elements output from a second plurality of sub-diffraction limit-sized light receptors, where at least one of the second plurality of sub-diffraction limit-sized light receptors is different from the first plurality of sub-diffraction limit-sized light receptors.

20. The method as in claim 11, performed during operation of an image sensor within a device.

21. The apparatus as in claim 1, where each sub-diffraction limit-sized light receptor has a diameter smaller than a 550 nanometer Airy disk.

* * * * *